(12) United States Patent
Madan et al.

(10) Patent No.: US 7,920,404 B2
(45) Date of Patent: Apr. 5, 2011

(54) FERROELECTRIC MEMORY DEVICES WITH PARTITIONED PLATELINES

(75) Inventors: Sudhir K. Madan, Richardson, TX (US); Hugh P. Mcadams, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 394 days.

(21) Appl. No.: 12/031,619

(22) Filed: Feb. 14, 2008

(65) Prior Publication Data
US 2009/0168489 A1  Jul. 2, 2009

Related U.S. Application Data

(60) Provisional application No. 61/017,840, filed on Dec. 31, 2007.

(51) Int. Cl.
G11C 11/22 (2006.01)

(52) U.S. Cl. ........ 365/145; 365/117; 365/148; 365/149; 365/230.06

(58) Field of Classification Search .................. 365/145, 365/117, 230.06, 65, 49.16
See application file for complete search history.

(56) References Cited

U.S. PATENT DOCUMENTS

| | | | |
|---|---|---|---|
| 6,046,928 A | 4/2000 | Takata | |
| 6,208,550 B1 | 3/2001 | Kim | |
| 6,487,103 B2 | 11/2002 | Yamamoto et al. | |
| 6,493,251 B2 | 12/2002 | Hoya et al. | |
| 6,510,073 B1 | 1/2003 | Lee et al. | |
| 6,661,697 B2 | 12/2003 | Yamamoto et al. | |
| 6,667,896 B2 | 12/2003 | Rickes et al. | |
| 6,906,945 B2 | 6/2005 | Madan | |
| 6,970,371 B1 | 11/2005 | Summerfelt et al. | |
| 7,009,864 B2 | 3/2006 | Madan | |
| 7,133,304 B2 | 11/2006 | Madan et al. | |
| 7,193,880 B2 | 3/2007 | Madan et al. | |
| 2003/0031042 A1 | 2/2003 | Yamamoto et al. | |
| 2003/0103372 A1 | 6/2003 | Matsushita | |
| 2003/0174532 A1 | 9/2003 | Matsushita et al. | |
| 2003/0206430 A1 | 11/2003 | Ho | |
| 2004/0090812 A1* | 5/2004 | Takashima | 365/145 |
| 2005/0207201 A1* | 9/2005 | Madan et al. | 365/145 |
| 2006/0023484 A1 | 2/2006 | Shiga et al. | |

(Continued)

OTHER PUBLICATIONS

"A Current-Based Reference-Generation Scheme for 1T-1C Ferroelectric Random-Access Memories", Joseph Wai Kit Siu, Yadollah Eslami, Ali Sheikholeslami, P. Glenn Gulak, Toru Endo and Shoichiro Kawashima, IEEE Journal of Solid-State Circuits, vol. 38, No. 3, Mar. 2003, pp. 541-549.

(Continued)

*Primary Examiner* — Pho M Luu
*Assistant Examiner* — Tha-o Bui
(74) *Attorney, Agent, or Firm* — Rose Alyssa Keagy; Wade J. Brady, III; Frederick J. Telecky, Jr

(57) ABSTRACT

One embodiment relates to a ferroelectric memory device. The ferroelectric memory device includes a segment of contiguous ferroelectric memory cells arranged in rows and columns. A row of ferroelectric memory cells includes a common wordline that allows access to the memory cells of the row and also includes at least two platelines associated with the row. At least one of the at least two platelines is associated with adjacent columns of ferroelectric memory cells within the row. The row of ferroelectric memory cells includes another word line which is not associated with the at least two platelines. Other methods and systems are also disclosed.

24 Claims, 9 Drawing Sheets

U.S. PATENT DOCUMENTS

2006/0146590 A1    7/2006   Fukushi et al.

OTHER PUBLICATIONS

"A 64 Mb Chain FeRAM with Quad-BL Architecture and 200MB/s Burst Mode", Katsuhiko Hoya, Daisaburo Takashima, Shinichiro Shiratake, Ruy Ogiwara, Tadashi Miyakawa, Hidehiro Shiga, Sumiko M. Doumae, Sumito Ohtsuki, Yoshinori Kumura, Susumu Shuto, Tohru Ozaki, Koji Yamakawa, Iwao Kunishima, Akihiro Nitayama and Shuso Fujii, ISSCC 2006/ Session 7/ Non Volatile Memory, IEEE International Solid-State Circuits Conference, Feb. 2006, 8 pgs.

"Bitline GND Sensing Technique for Low-Voltage Operation FeRAM", Shoichiro Kawashima, Toru Endo, Akira Yamamoto, Ken'Ichi Nakabayashi, Mitsuharu Nakazawa, Keizo Morita and Masaki Aoki, IEEE Journal of Solid-State Circuits. vol. 37, No. 5, May, 2002, pp. 592-598.

"A Survey of Circuit Innovations in Ferroelectric Random-Access Memories", Ali Sheikholeslami and P. Glenn Gulak, Proceedings of the IEEE, vol. 88, No. 5, May 2000, pp. 667-689.

* cited by examiner

FERROELECTRIC MEMORY DEVICES WITH PARTITIONED PLATELINES

RELATED APPLICATION

This application claims priority to Ser. No. 61/017,840 filed Dec. 31, 2007, which is entitled "Ferroelectric Memory Devices With Partitioned Platelines."

FIELD OF INVENTION

The present invention relates generally to semiconductor memory devices and more particularly to improved methods and systems for ferroelectric memory devices.

BACKGROUND OF THE INVENTION

Semiconductor memory devices store data and/or program code in personal computer systems, embedded processor-based systems, video image processing circuits, communications devices, and the like. A ferroelectric memory device is one type of semiconductor memory device.

Ferroelectric memory devices provide non-volatile data storage by employing ferroelectric capacitors that are constructed using ferroelectric dielectric material that may be polarized in one direction or another in order to store a binary value. The ferroelectric effect allows for the retention of a stable polarization in the absence of an applied electric field due to the alignment of internal dipoles within perovskite crystals in the ferroelectric material. This alignment may be selectively achieved by application of an electric field in a first direction that exceeds a coercive field of the material. Conversely, reversal of the applied field reverses the internal dipoles, wherein the response of the polarization of a ferroelectric capacitor to the applied voltage may be plotted as a hysteresis curve.

Given the technological complexity of ferroelectric memory devices, these products require significant capital expenditures in order to be successfully developed and delivered to the marketplace. Thus, developers rely on strong intellectual property rights in this arena to allow them to rationalize and protect the huge capital expenses involved.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment relates to a ferroelectric memory device. The ferroelectric memory device includes a segment of contiguous ferroelectric memory cells arranged in rows and columns. A row of ferroelectric memory cells includes a common wordline that allows access to the memory cells of the row and also includes at least two platelines associated with the row. At least one of the at least two platelines is associated with adjacent columns of ferroelectric memory cells within the row. Other methods and systems are also disclosed.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
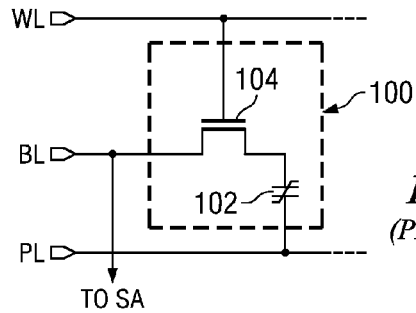
FIG. 1 is a schematic diagram illustrating a conventional 1T1C cell.

One or more implementations of the present invention will now be described with reference to the attached drawings, wherein like reference numerals are used to refer to like elements throughout. Although some embodiments of the invention are described below with reference to a four megabit (4 Mb) ferroelectric memory device, it will be appreciated that the invention could extend to any ferroelectric memory device, regardless of size. For example, a ferroelectric memory device could be much smaller (e.g., a 2 bit device with two ferroelectric memory cells) or could be much larger (e.g., a terabit device with $10^{12}$ ferroelectric memory cells), where all such variations are contemplated as falling within the scope of the invention. Further, to the extent that a memory array as discussed herein is subdivided into sections, segments, plateline groups, and the like, it will be appreciated that the size of these subdivisions could vary depending on design constraints.

Ferroelectric memory cells in accordance with the invention can be organized in single-transistor, single-capacitor (1T1C) or two-transistor, two-capacitor (2T2C) configurations. FIG. 1 illustrates an exemplary 1T1C ferroelectric memory cell 100 that includes a single ferroelectric capacitor 102 and an access transistor 104. The access transistor 104 serves to connect the cell capacitor 102 between a bitline BL and a plateline PL.

Figure 2:
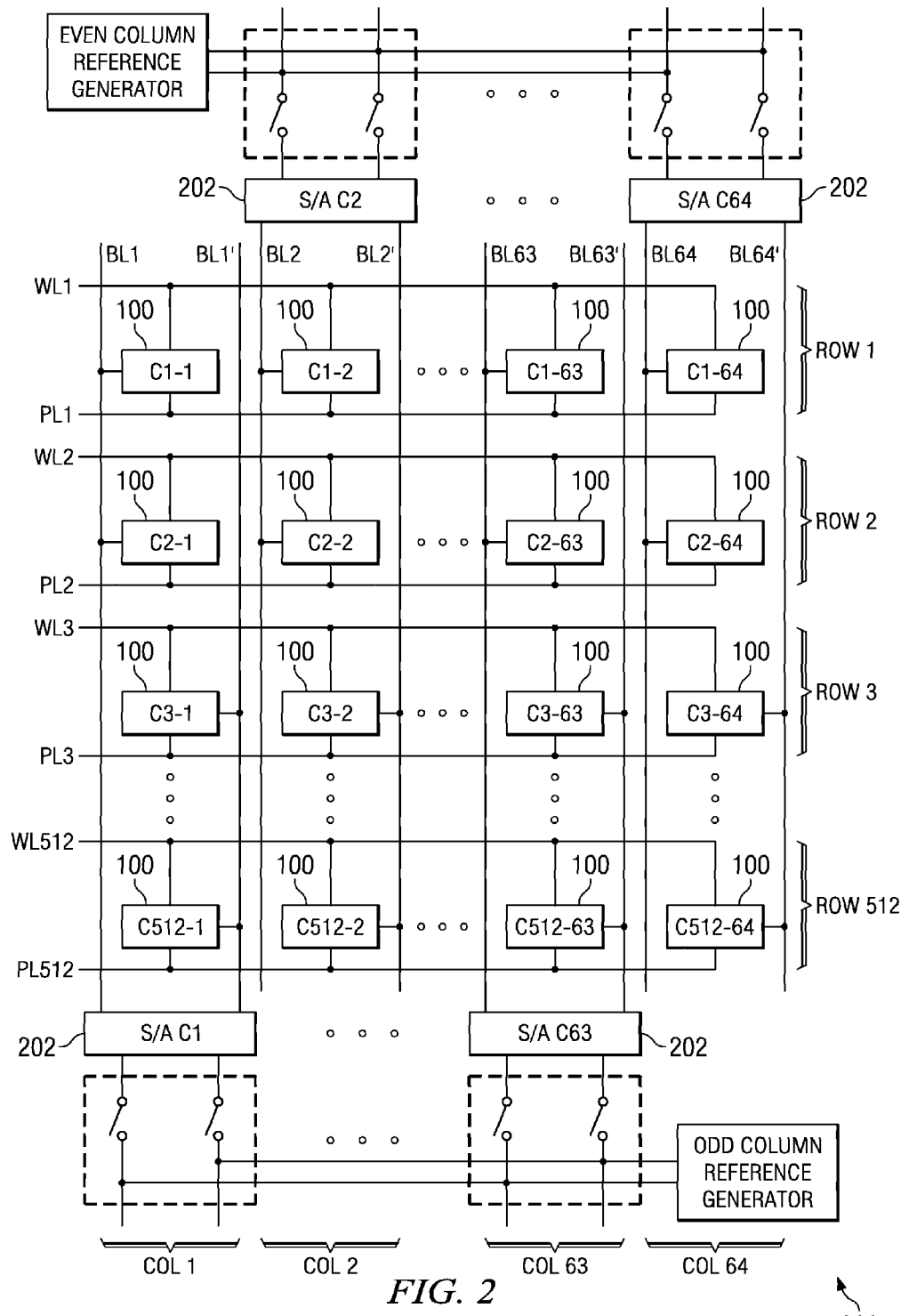
FIG. 2 is a schematic diagram illustrating a conventional 1T1C folded bitline ferroelectric memory device.

FIG. 2 illustrates a 32 kilobit (32 Kb) ferroelectric memory device 200, where memory cells 100 are arranged in 512 rows (words) and 64 columns (bits), indicated as $C_{ROW\text{-}COLUMN}$. Each row of memory cells is associated with a unique wordline and plateline, and each column of memory cells is associated with a unique pair of complementary bitlines $BL_{COLUMN}$ and $BL_{COLUMN}'$. In Row 1, for example, the cells $C_{1\text{-}1}$ through $C_{1\text{-}64}$ form a 64 bit data word associated with WL1, PL1, and complementary bitline pairs BL1/BL1' through BL64/BL64'. Notably, all of the cells in each row are coupled to a single plateline or plateline driver.

During a typical write operation to Row 1, a voltage $V_{w1}$ is applied to wordline WL1, wherein the $V_{w1}$ is typically greater than or equal to a supply voltage VDD plus a threshold voltage of the access transistors, thereby turning on the access transistors 104 within Row 1 and coupling the bitlines BL1-

BL64 to the ferroelectric capacitors 102 in the accessed cells. Suitable voltages are then applied to the bitlines BL1-BL64, where the voltage on each bitline is representative of a data value to be written to the memory cell attached to that bitline. While the wordline WL1 and bitlines are properly biased, the plateline PL1 is pulsed high, polarizing the ferroelectric dielectric material, and thereby storing one of at least two data states in each of the accessed memory cells.

During a typical read operation of Row 1, voltage $V_{w1}$ is again applied to wordline WL1 to turn on the access transistors 104 and couple the bitlines BL1-BL64 to the ferroelectric capacitors 102 of the accessed cells 100. The plateline PL1 is then pulsed high, causing the ferroelectric capacitors 102 to discharge charge through the access transistors 104 to the bitlines BL1-BL64, thereby causing the bitline voltages BL1-BL64 to rise. The amount by which the bitline voltages rise depends upon the state of the ferroelectric capacitors being accessed. To determine whether the state of the accessed ferroelectric capacitors is a "1" or a "0", one differential input terminal of each sense amp 202 is coupled to a memory cell's bitline (e.g., bitline BL1) and the other differential input of each sense amp 202 is coupled to a reference voltage (e.g., reference bitline BL1'in this example). Depending upon whether the memory cell's bitline (e.g., bitline BL1) is high or low relative to the reference voltage (e.g., bitline BL1'), each sense amp 202 returns a "1" or a "0".

As the inventors have appreciated, however, such a memory device 200 is less than ideal for several reasons. For example, consider the scenario where a user wants to write data to less than a full row of memory cells. For example, in FIG. 2, the user may want to write only 8 bits of data into Row 1 (e.g., cells $C_{1-1}$ through $C_{1-8}$). To accomplish this write operation, wordline WL1 will be asserted, thereby accessing all 64 memory cells Row 1. While the wordline WL1 is asserted, the bitline pairs BL1, BL1' through BL8-BL8' will be suitably biased, and the plateline PL1 for the entire row will be pulsed. However, because the wordline WL1 and plateline PL1 are coupled to all of the cells in the row, data will be effectively written to all 64 cells (and not just cells $C_{1-1}$ through $C_{1-8}$). Therefore, to successfully write a partial word, the entire row will first have to be read so the existing data can be determined. Then, the new data values can be presented on the bitlines BL1, BL1' through BL8-BL8', while the previous data values (unchanged) are re-presented on bitlines BL9, BL9' through BL64-BL64'. While this combination of new and previous data values are presented on the bitlines with the wordline asserted, the plateline can be pulsed, thereby writing the data values into the cells.

Although this methodology is effective, it is inefficient because it results in excess power dissipation. The excess power dissipation occurs because data is first read from the entire row, and then data is written to all of the cells of the row (including some data that was previously present in the row). Because a user wants to write data to only a partial row (and not a full row), this wastes power. Thus, in memory devices used in low power applications, such as a portable electronic device or RFID, it would be advantageous to minimize the amount of excess power dissipation.

Figure 3:
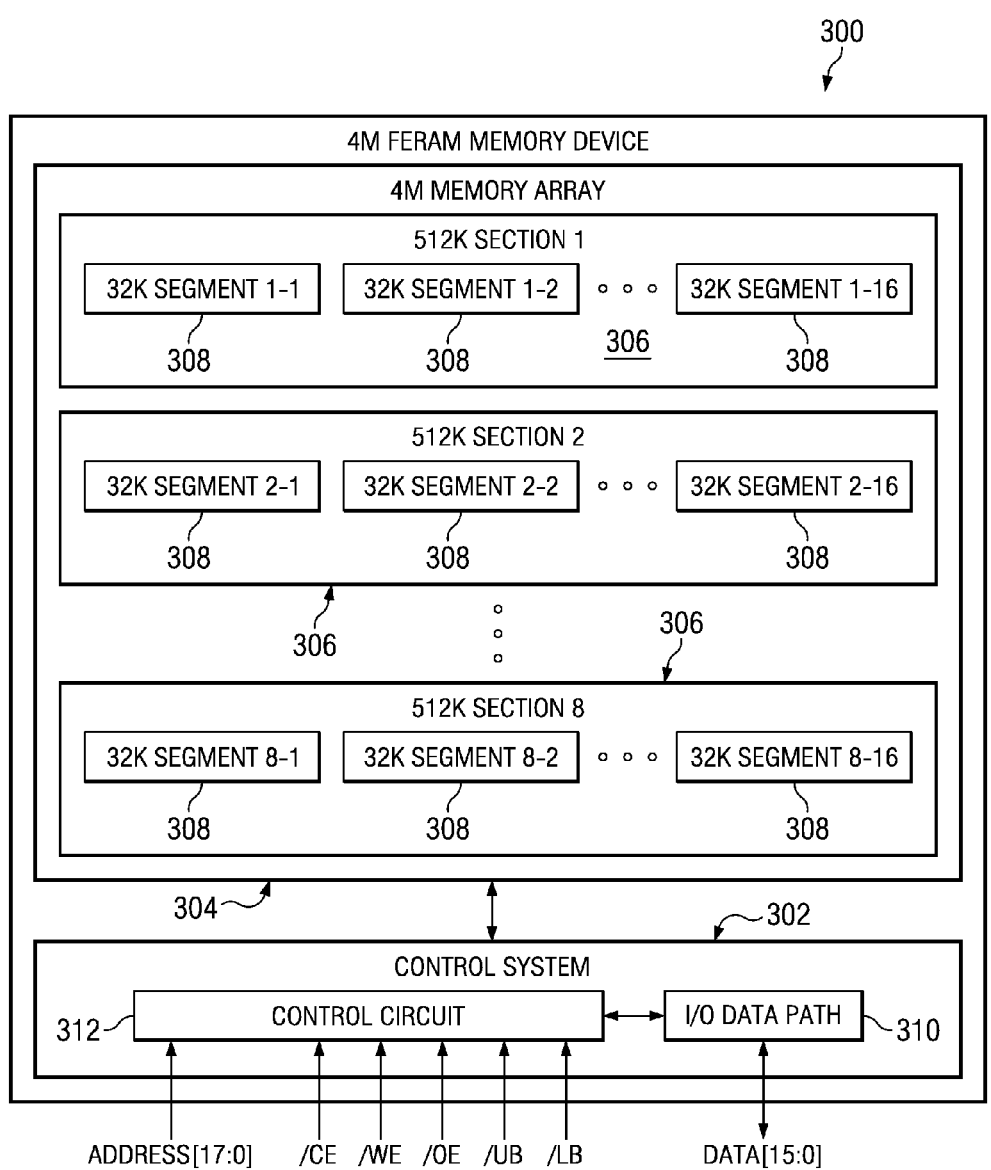
FIG. 3 is a schematic diagram illustrating an exemplary ferroelectric memory device in accordance with some aspects of the invention.

To remedy these and other shortcomings, the inventors have fashioned advantageous ferroelectric memory devices. As shown in FIG. 3, one embodiment of such a ferroelectric memory device is a 4 Mb ferroelectric memory device 300 that includes a control system 302 and memory array 304. Although FIG. 3 is illustrated and discussed with reference to a 4 Mb ferroelectric memory device for purposes of simplicity and clarity, the invention could extend to any ferroelectric memory device, regardless of size.

The memory array 304 includes at least $2^{22}$ ferroelectric memory cells (i.e., four megabits), and often some dummy ferroelectric memory cells in addition thereto. The ferroelectric memory cells are arranged in eight 512 Kb memory sections 306, where each memory section 306 is subdivided into sixteen segments 308 of 32 Kb each. For example, in the lower right-hand corner of the array 304, one can see the sixteenth segment within the eighth section labeled as "32K Segment 8-16." Often, plateline drivers and/or other peripheral circuitry, such as power conduits, are situated between adjacent segments. Thus, the memory cells within each segment are contiguous, but due to the plateline drivers and/or other peripheral circuitry, the memory cells between segments may be non-contiguous. Such a layout allows for efficient routing and power distribution.

In various embodiments, the segments 308 may also include dummy ferroelectric memory cells therein. For example, in a typical embodiment, columns of memory cells at the edges of the segment may be dummy memory cells. These dummy memory cells help to minimize variations between active memory cells located at the center and edges of the array. Typically, dummy cells are substantially identical to the active cells. However, some functionality and layout for these cells may be modified to suit specific requirements.

The control system 302 is coupled to the memory array 304 and provides suitable biasing voltages to write and read data to and from individual ferroelectric memory cells. More specifically, the control system 302 includes an data path 310 and a control circuit 312, where the control circuit 312 generates wordline, bitline, and plateline signals according to decoded address information and/or signals for read, restore, and write operations. These signals could include, for example, chip enable (CE), write enable (WE), output enable (OE), upper byte enable (UB), lower byte enable (LB), address [17:0], and data[15:0], as shown. The I/O data path 310 includes sense amps for reading and writing data values to the individual memory cells. Often these sense amps are respectively associated with columns of memory cells, such as previously shown in FIG. 2.

Figure 4:
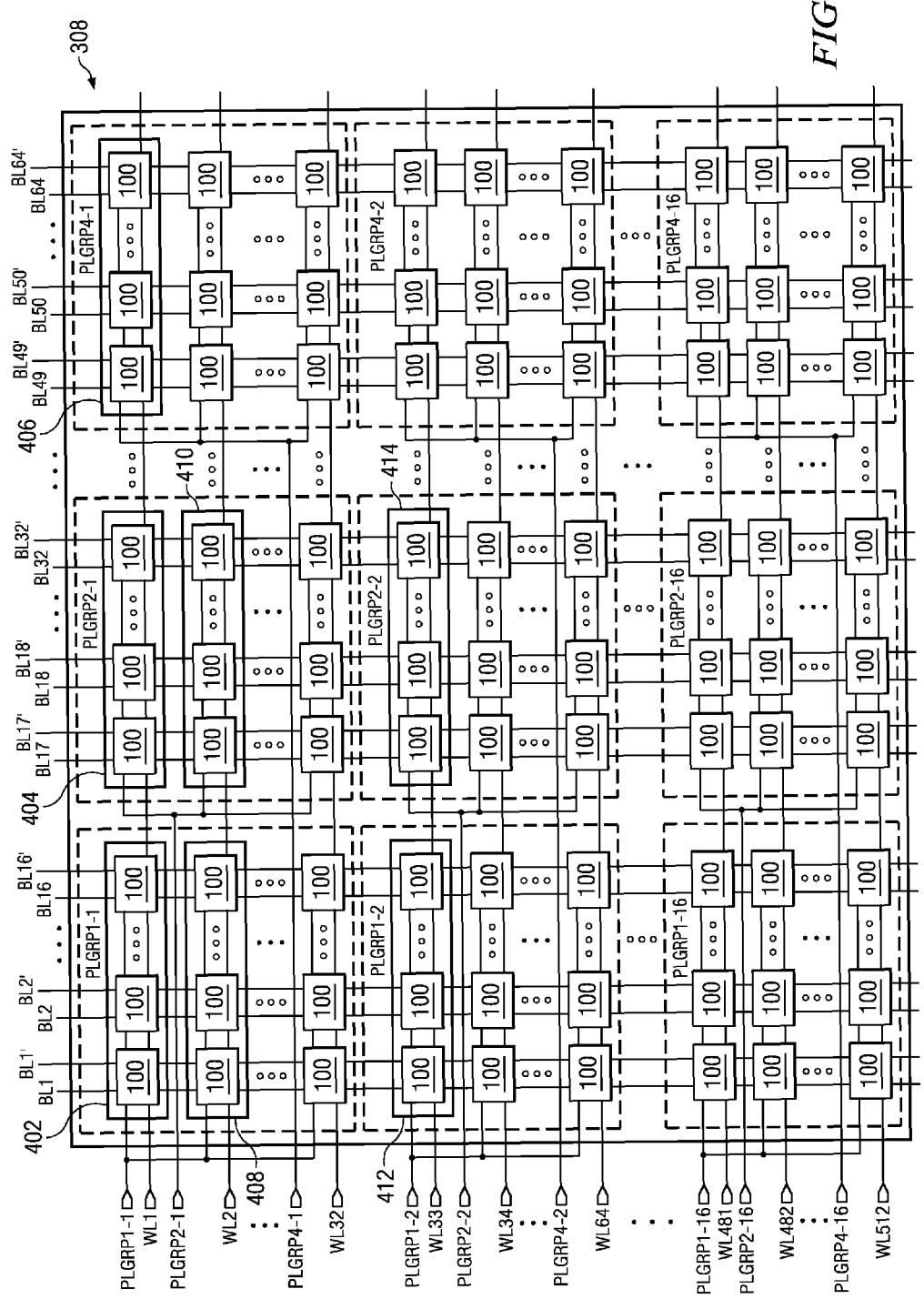
FIG. 4 shows a schematic diagram illustrating a portion of an exemplary section that includes a number of segments in accordance with some aspects of the invention.

FIG. 4 shows a segment 308 of the memory array 304 in more detail. As shown, the segment 308 includes memory cells 100 that are arranged in rows (each row accessible via a unique wordline) and columns (each column associated with a unique pair of complimentary bitlines). In various embodiments, the wordlines may extend across multiple horizontally adjacent segments, and the bitlines may extend across multiple vertically adjacent sections.

In ferroelectric memory devices, both PL and WL have to be activated to access a cell. In the prior art, a common plate line architecture where a PL is common to several rows of WL's is often used to minimize area associated with the PL drivers.

In the present invention, within the segment 308, multiple plategroups are associated with each column and multiple plategroups are associated with each row. In the illustrated embodiment, for example, the memory cells 100 are partitioned into sixty-four plate groups (e.g., PLGRP 1-1; PLGRP 2-1; . . . ; PLGRP4-16), although they could also be partitioned into other numbers of plategroups depending on design considerations. Notably, along a given wordline, there are multiple independently assertable plategroups, each of which can bias less than the entire wordline of memory cells.

For example, the first row of memory cells along wordline WL1 is associated with four plategroups (PLGRP1-1, PLGRP2-1, PLGRP3-1, PLGRP4-1), each of which is associated with a unique set of memory cells. More specifically, a first set of cells 402 along WL1 is driven by a plateline driver PLGRP1-1 DRV and a second set of cells 404 along WL1 is driven by a plateline driver PLGRP2-1 DRV. Additional sets of cells (e.g., additional set 406) along WL1 could also be driven by their respective plateline drivers. Due to these "partitioned" platelines along each wordline, this segment 308 advantageously allows a user to write to a partial row of memory cells along a given wordline.

The second row of memory cells along WL2 is also partitioned into several plateline groups. For example, a third set of cells 408 shares a plateline with the first set of cells 402, and thus has a plateline driven by plateline driver PLGRP1-1 DRV. A fourth set of cells 410 shares a plateline with the second set of cells 404, and has a plateline driven by plateline driver PLGRP2-1 DRV.

Additional plategroups could also be tiled together in this manner. Thus, along WL33, a fifth set of cells 412 associated with a third plategroup PLGRP1-2 is driven by an independent plategroup driver. Similarly, a sixth set of cells 414 is associated with a fourth plategroup PLGRP 2-2, and is driven by an independent plategroup driver.

The illustrated embodiment has been selected because it provides a good balance between low power consumption and relatively limited area. Thus, although platelines could be partitioned into larger or smaller sets of memory cells, associating a row of cells that spans 64 columns with 4 sets of cells is beneficial.

Figure 5:
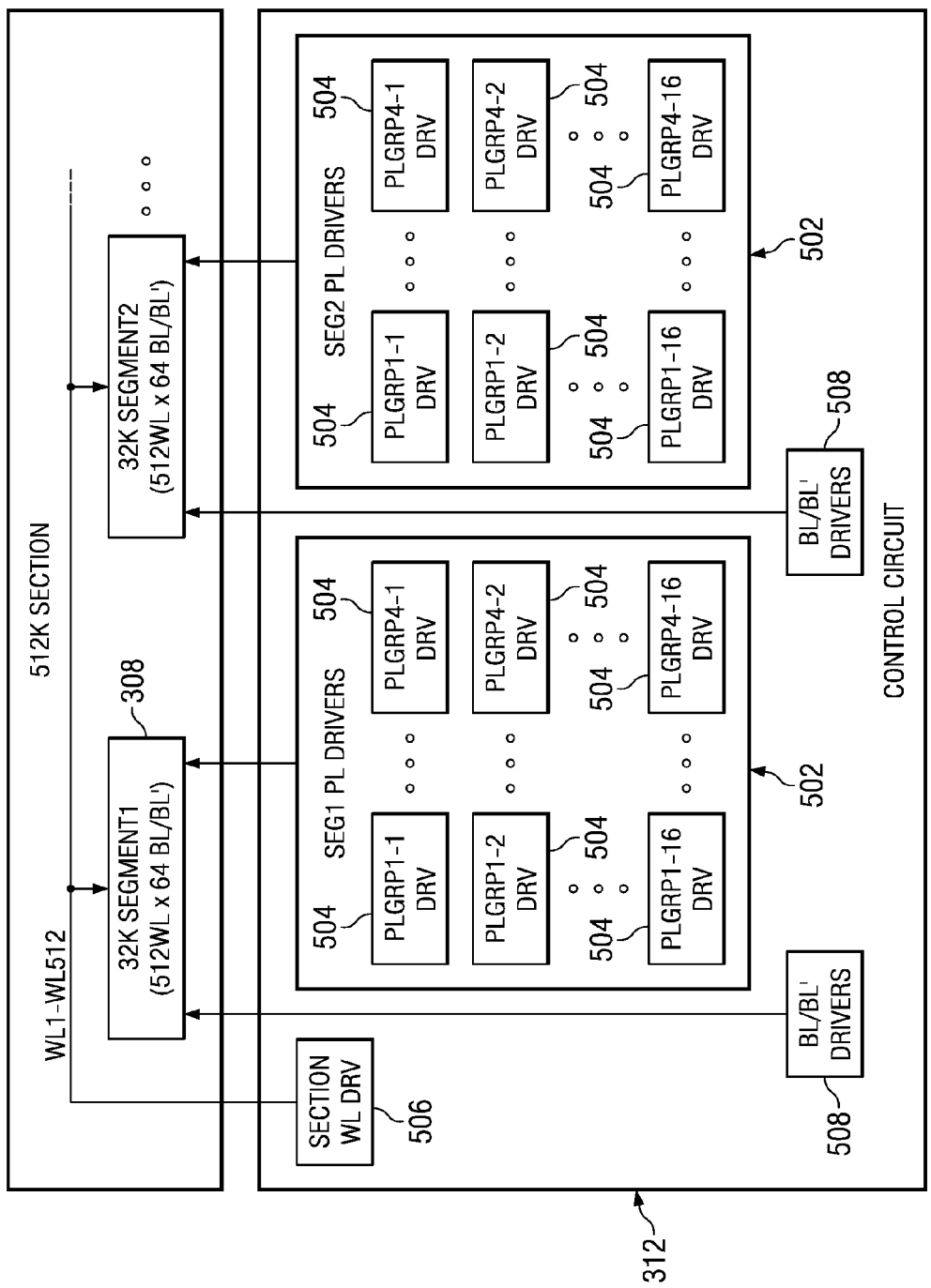
FIG. 5 is a schematic diagram illustrating one embodiment of how plateline drivers in a control circuit can be coupled to a section of an exemplary a ferroelectric memory device in accordance with some aspects of the invention.

Referring now to FIG. 5, one can see some details of how the control circuit 312 can work in conjunction with the partitioned platelines to reduce power consumption from what has previously been achievable. As shown, the control circuit 312 includes a set of plateline drivers 502 that is associated with each segment 308. Within each set of plateline drivers 502, an individual plateline driver 504 provides a plateline voltage signal to an individual plategroup within a predetermined segment 308. For example, segment "32K Segment 1" is associated with the set of plateline drivers "SEG 1 PL DRIVERS", which consists of sixty-four individual plateline drivers "PL1-1 DRV; PL 1-2 DRV; . . . ; PL4-16 DRV". By briefly cross-referencing FIG. 4, one can see that plateline driver PL1-1 DRV provides a plateline voltage signal to the plategroup PLGRP1-1. The other plateline drivers are similarly associated with individual plategroups. Wordline drivers 506 and bitline drivers 508 may also be included in the control circuit as shown.

Typically, within a set of plateline drivers 502 only one individual plateline driver 504 associated with a row of memory cells is asserted at a time. This may facilitate reduced power consumption. However, in some control circuits the more than one individual plateline driver may be asserted simultaneously. For example, two plateline drivers associated with different rows could be asserted simultaneously. Also, if a user desired to write to two partial words along a given row, two plateline drivers associated with the given row could be asserted.

Due to the partitioned platelines, a segment 308 and its associated set of plateline drivers 502 advantageously allow a user to write to a partial row of cells with lower power dissipation than previously achievable. For example, in FIG. 4, a user can write to a partial word (e.g., the first sixteen bits of WL1) by asserting the wordline WL1 via the segment wordline driver, presenting suitable biases on BL1, BL1' through BL1 6, BL1 6' with the associated bitline drivers, and then pulsing PLGRP1-1 (while the other plategroups associated with WL1 are not pulsed). Although WL1 accesses all cells in along wordline WL1, data will be written only to the accessed cells coupled to PLGRP1-1 due to the partitioned platelines. Accordingly, this segment 308 may limit the power dissipation from what has previously been achievable. For example, the inventors have used SPICE modeling to estimate that power consumption could be reduced by approximately 43% compared to prior solutions, although these power savings may vary as a function of the types of accesses carried out and many other variables.

When the platelines are partitioned as described above, sense amps respectively associated with columns of the segment 308 could also be partitioned. In particular, the sense amp control signals could be partitioned so that all sense amps in columns associated with a set of memory cells (e.g., set 402, set 404) receive common sense amp control signals. These common sense amp control signals could be independent of sense amp control signals in columns associated with another set of memory cells.

In one embodiment, the following sense amp control signals could be partitioned: a sense-amp power signal (SAPWR), a sense-amp pre-charge signal (SAPRC), a sense amp input activation signal (SAINP), a sense-amp write back signal (SAWB), a bitline restore or pull-up (BLRESTORE) and a sense-amp read/write between sense amp and local I/O line signal (SARDWRT). In this embodiment, the following sense amp controls signals could be common to all sense-amps (i.e., be un-partitioned): a bit-line pre-charge signal (BLPRC), and a sense-amp pull-down signal (SAPDN). Thus, the sense amp control signals could also partitioned based on functionality, power, and design complexity considerations. Partitioning the sense amp control signals reduces the load capacitances that the sense amp control signals drive, thereby saving power. However, partitioning also increases the gate count for the control logic, which could increase the power as well as add to the area and complexity for the control logic.

Figure 6:
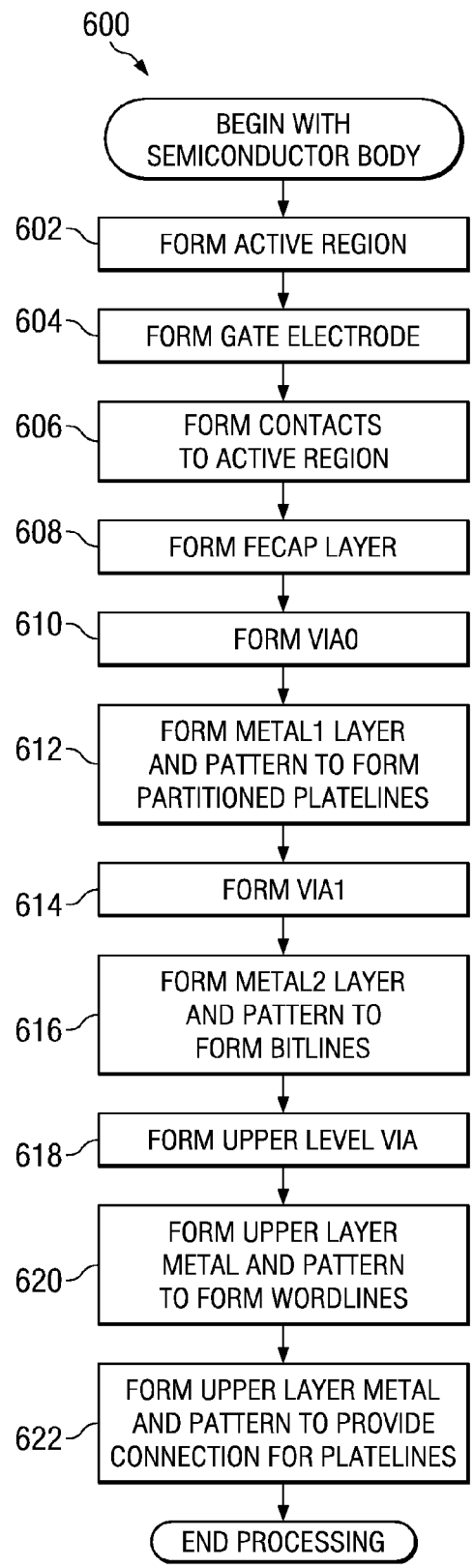
FIG. 6 is a flow diagram illustrating one embodiment of a method for forming a ferroelectric memory device in accordance with aspects of the invention.

Now that some embodiments of a ferroelectric memory device in accordance with some aspects of the invention have been set forth, several examples of methods for manufacturing these and other ferroelectric memory devices are now discussed with reference to FIGS. 6-10. FIG. 6 shows a somewhat general method 600, while FIGS. 7-10 show a more detailed method 700 with reference to a series of layout and cross-sectional views. In these methods 600, 700, a segment of contiguous ferroelectric memory cells is formed where platelines are partitioned so that multiple plategroups are associated with a given wordline of the segment. While the methods are illustrated and described below as a series of acts or events, the present invention is not limited by the illustrated ordering of such acts or events. For example, some acts may occur multiple times and/or in different orders and/or concurrently with other acts or events apart from those illustrated and/or described herein. In addition, not all illustrated steps may be required to implement a methodology in accordance with one or more aspects of the present invention. Further, one or more of the acts depicted herein may be carried out in one or more separate acts or phases. Additionally, while the discussion herein is made with reference to a ferroelectric memory device, it is to be appreciated that one or more aspects of the present invention may have application to different types of memories and/or to other structures or circuits not illustrated or described herein.

Referring now to FIG. 6, one can see the somewhat general method for manufacturing a segment of contiguous ferroelectric memory cells. In block 602, active regions are formed within a semiconductor body. In block 604, gate electrodes, such as polysilicon gate electrodes, and which correspond to wordlines are formed over the semiconductor body. In block 606, a dielectric is formed over the gate electrode and contacts are formed through the dielectric to the active regions. In block 608, a ferroelectric dielectric material is formed and patterned. In block 610, via0's are formed through a dielectric layer overlying the ferroelectric dielectric layer. In 612, a metal1 layer is formed and patterned to form partitioned platelines. In 614, via1's are formed through the metal1 layer. In 616, a metal2 layer is formed and pattern to form bitlines. In 618, upper level vias are formed. In block 620, an upper metal layer is formed and patterned to form wordlines and in block 622, an upper level metal layer is used to form connections between the platelines in the array and the plateline drivers Referring now to FIGS. 7-10, one can see a more detailed method for manufacturing a segment of contiguous ferroelectric memory cells, which method is merely one example of how FIG. 6's method could be implemented. These figures show top-layout views (FIGS. 7A, 8A, 9A, 10A), and cross sectional views (FIGS. 7B, 8B, 9B, 10B) as indicated. Some layers may not be shown in all of the figures for purposes of clarity and readability. For example, the top-layout views do not explicitly show a gate oxide layer, but the cross-sectional views do show the gate oxide layer.

Figure 7A:
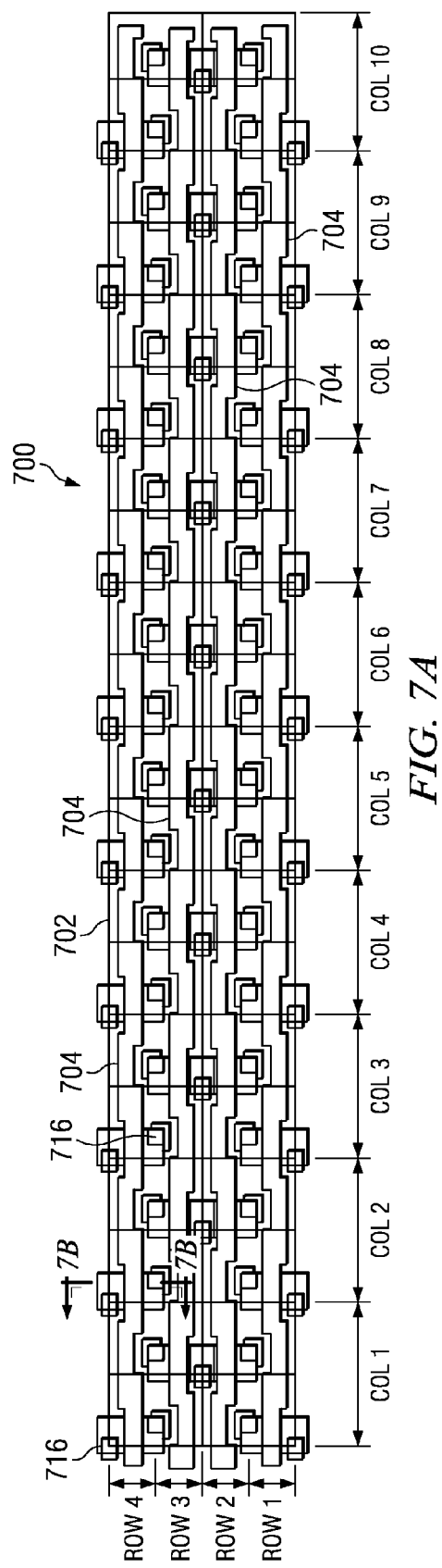
FIGS. 7-10 include top layout views and cross sections of a ferroelectric memory device at various stages of manufacture in accordance with one embodiment consistent with the method of FIG. 6.

Referring to FIG. 7A, one can see an illustrated segment 700 of forty memory cells (e.g., memory cell 702) that are arranged in four rows and ten columns. Because the cells are directly adjacent to one another, FIG. 7A shows one example of memory cells that are contiguous. Four polysilicon wordlines 704 allow access to cells in every column. For purposes of illustration, the left-most and right most columns (column1 and column 10) in each row may be considered dummy cells or dummy columns.

Figure 7B:
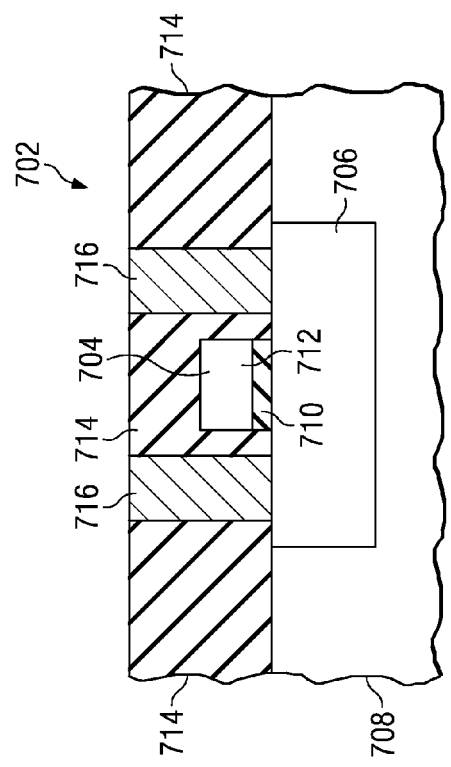

When FIGS. 7A-7B are viewed together, one can see that each memory cell includes an active region 706 formed within a semiconductor body 708. The semiconductor body 708 could comprise bulk silicon, gallium arsenide, semiconductor on insulator (e.g, silicon on insulator), or any other semiconductor body. The active regions 706 are often relatively lightly doped in the channel region under the gate and highly doped in source and drain regions (such as n+ or p+ regions), and are often implanted via an ion implanter, although they could be formed in other ways. Typically the channel doped region is formed before the gate formation and source and drain regions are formed after the gate formation. To form the wordline 704, a thin gate oxide 710 is formed over the active region 706, after which a layer of polysilicon 712 is formed. Photoresist or some other mask is typically patterned over the polysilicon 712, and an etch is then performed to form the wordline (gate) structure 704. A dielectric 714 is then formed over the wordline 704 and semiconductor body 708, and contacts 716 are formed therein.

Figure 8A:
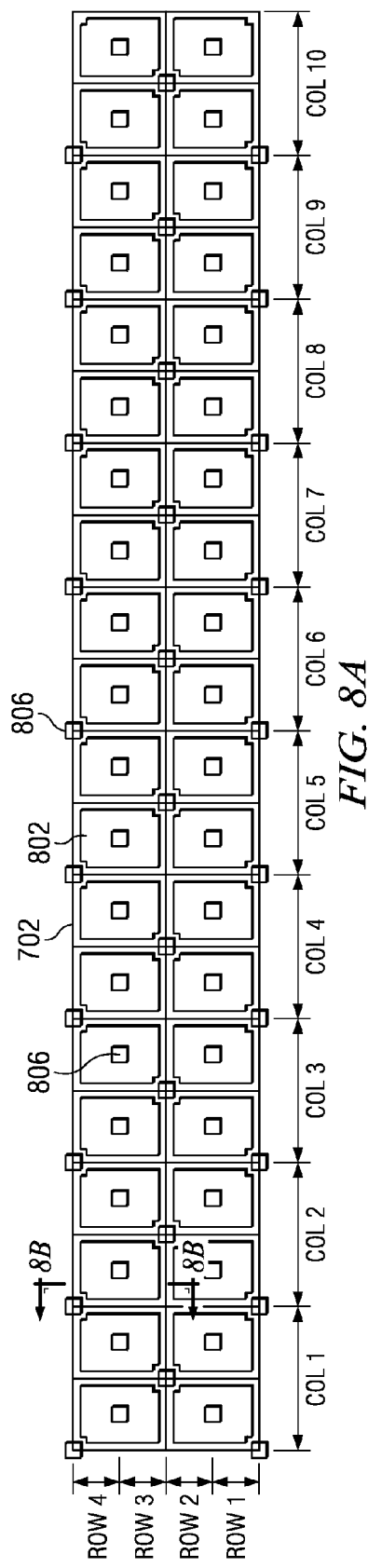
Figure 8B:
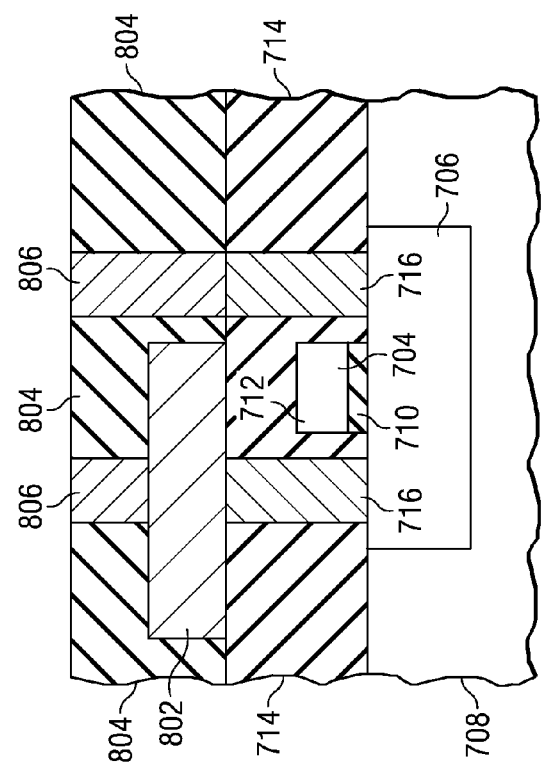

As shown in FIGS. 8A-8B, a ferroelectric dielectric material is then formed over the structure. A mask is then patterned over the ferroelectric dielectric material, and the ferroelectric dielectric material is patterned to form ferroelectric capacitor structures 802 within each cell. Another dielectric layer 804 is formed over the ferroelectric capacitor structures 802, and via0's 806 are formed therein, where some via0's are coupled to the top surface of the ferroelectric capacitor structures 802 and other via0's are coupled to the top surface of contacts 716.

Figure 9A:
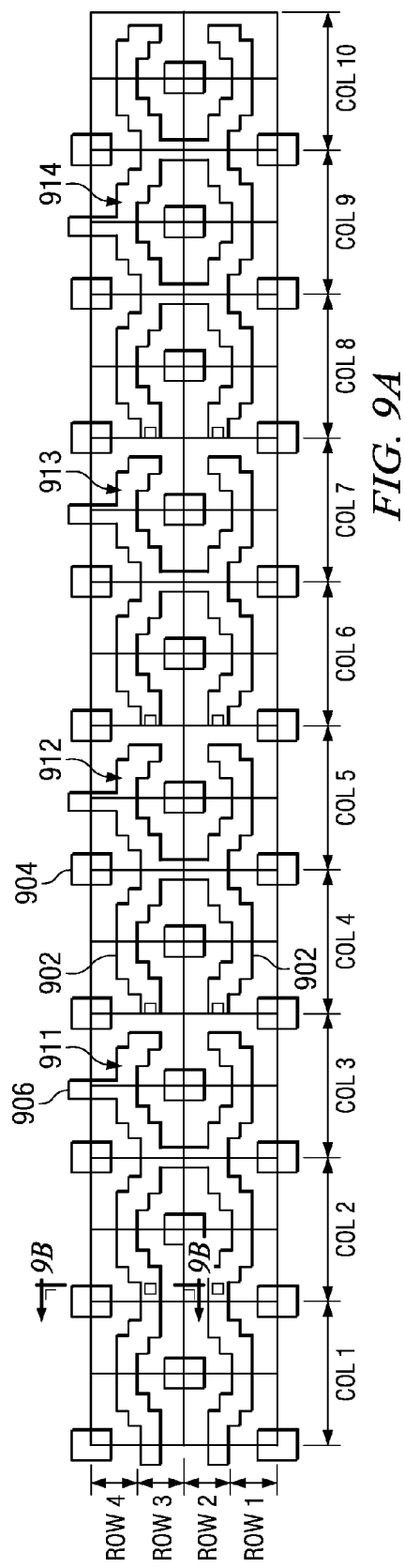
Figure 9B:
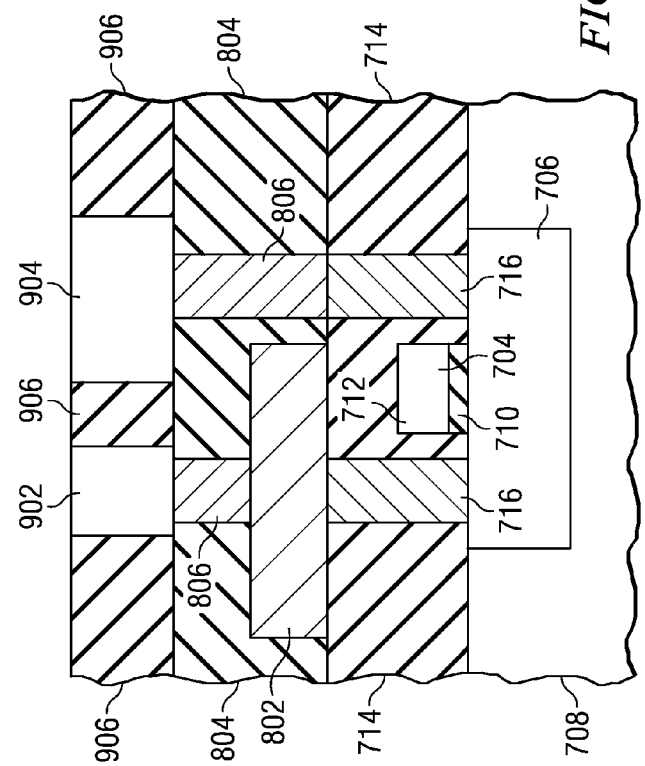

As shown in FIGS. 9A-9B, a first metal layer is then formed over the structure. A mask is then patterned over the first metal layer, and the first metal layer is patterned to form platelines 902 and bitline landing pads 904. As shown in FIG. 9A, within a given row of memory cells, there are multiple platelines extending across the segment. Along each row in the illustrated embodiment, the platelines are partitioned into four sets of cells. A first set of cells or plate group in Rows 1-4 are associated with Columns 2 and 3 as indicated by plategroup 911. The second set of cells is associated with columns 4 and 5 as indicated by plategroup 912. Additional sets of cells 913, 914 are associated with columns 6 and 7 and with columns 8 and 9, respectively. To add more rows to the plategroups, vertical members 906 extend across a cell boundary and could connect to another row of cells on the top.

Figure 10A:
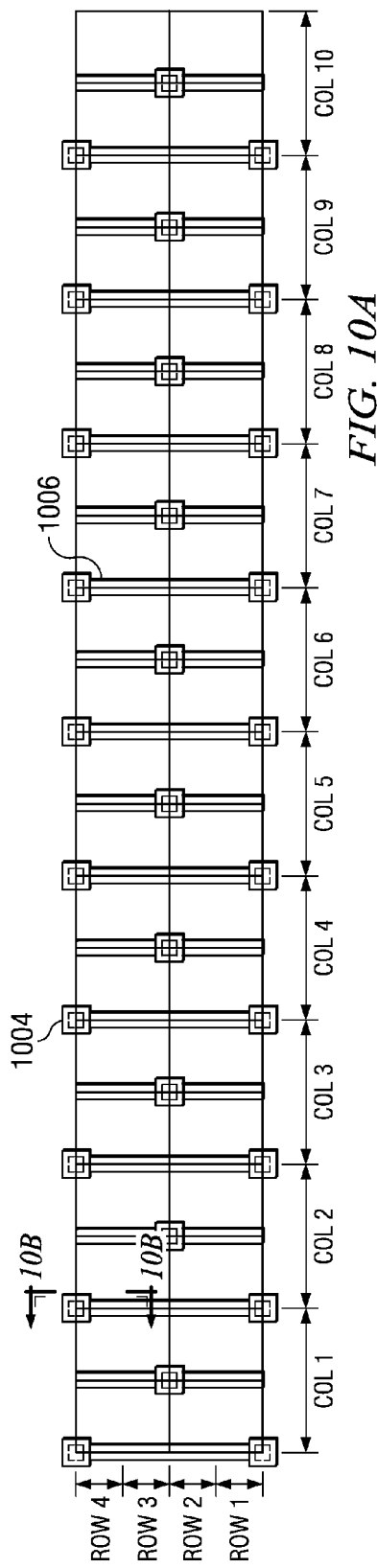
Figure 10B:
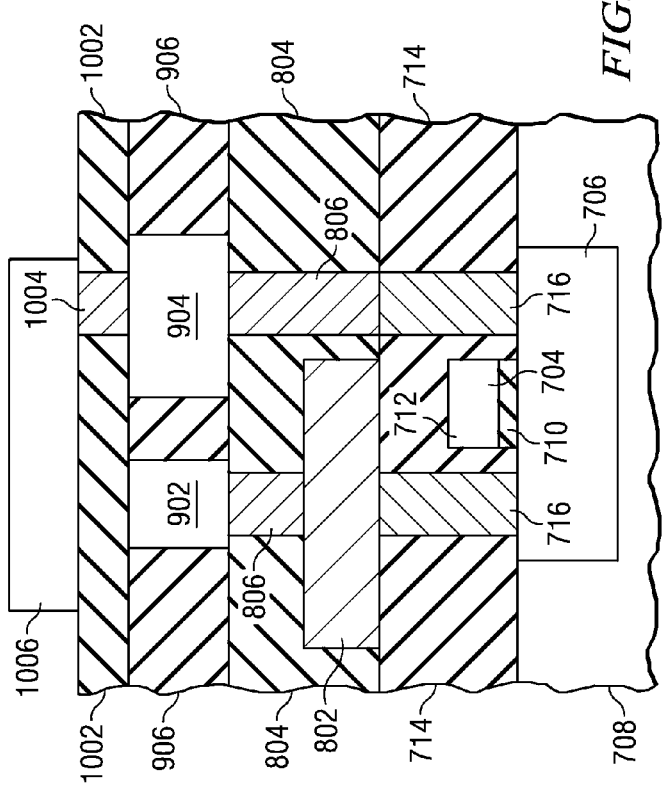

As shown in FIGS. 10A-10B, after another dielectric layer 1002 has been formed over the first metal layer and via1's 1004 have formed in the dielectric layer 1002, a second metal layer can be formed. This second metal layer can then be patterned to form bitlines 1006 that are electrically coupled to a portion of the active region 706.

The PL drivers (not shown) for the above 4 sets of cells associated with 4 plategroups are located on the left of the segment near the column 1 and the connections from the PL drivers to the individual plategroups (911-914) can made in one or more higher level metal layers. For example they could be made in $3^{rd}$, $4^{th}$ and or $5^{th}$ layer of metals and connect to metal 1 plategroups inside the array through Via's and Metal 2 landing pad placed in between bitlines. This connection need only be made at one place per plategroup. The vertical metal connections 906 in FIG. 9A could provide the connection for all the cells in a plate group.

Besides PL connections from the drivers to the cells inside array, higher metal levels may also be used for metal wordlines (which are coupled to the poly wordlines 712) and I/O data path lines.

In the region between the segments, poly wordlines can also be strapped with the metal lines to reduce the overall resistance for the long wordlines. The region could also be used to tie the substrate to the Vss ground metal line from the top.

Although some embodiments have been described and illustrated herein with respect to a 1T1C memory cell configuration, it will be appreciated that the invention is equally applicable to 2T2C memory cell configurations. For example in some 2T2C memory cell configurations, FIGS. 7A-10A could be modified so that there are only two rows (instead of the four rows currently shown).

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A ferroelectric memory device that includes a segment of contiguous ferroelectric memory cells arranged in columns and rows, comprising:

a first row of contiguous ferroelectric memory cells comprising: a first wordline and multiple platelines that allow access to the memory cells of only the first row, where at least one of the platelines is associated with at least two adjacent columns of ferroelectric memory cells within the row; and a second row of contiguous ferroelectric memory cells associated with a second wordline that is assertable independently of the first wordline and associated with additional platelines that are assertable independently of the multiple platelines and allow access to the memory cells of only the second row.

2. The ferroelectric memory device of claim 1, further comprising:

multiple plateline drivers configured to independently assert the first row's multiple platelines, respectively.

3. The ferroelectric memory device of claim 2, further comprising:

another segment of contiguous ferroelectric memory cells, where a row in the another segment includes memory cells coupled to the first wordline.

4. The ferroelectric memory device of claim 3, where the peripheral circuitry comprises the multiple plateline drivers.

5. The ferroelectric memory device of claim 1, where the ferroelectric memory cells comprise at least one of: 1T1C memory cells and 2T2C memory cells.

6. The ferroelectric memory device of claim 1, where the multiple platelines comprise at least three platelines.

7. A ferroelectric memory device, comprising:

a segment of contiguous ferroelectric memory cells arranged in rows and columns and comprising: a first set of ferroelectric memory cells associated with a first plategroup that includes at least two adjacent columns and accessible via a first wordline and a first plateline, and a second set of ferroelectric memory cells associated with a second plategroup and accessible via the first wordline and a second plateline;

first and second plateline drivers configured to independently assert the first and second platelines, respectively; and an other wordline that is assertable independently of the first wordline and associated with an other plateline that is assertable independently of the first and second platelines.

8. The ferroelectric memory device of claim 7, where the segment further comprises:

additional sets of ferroelectric memory cells coupled to the first wordline, each additional set associated with an additional plategroup and an additional plateline; and additional plateline drivers, each additional plateline driver configured to assert an additional plateline independent of the other platelines.

9. The ferroelectric memory device of claim 7 where the segment further comprises:

a third set of ferroelectric memory cells associated with the first plategroup and accessible via a second wordline and the first plateline; and a fourth set of ferroelectric memory cells associated with the second plategroup and accessible via the second wordline and the second plateline.

10. The ferroelectric memory device of claim 9, further comprising:

first and second wordline drivers configured to independently assert the first and second wordlines, respectively.

11. The ferroelectric memory device of claim 9, where the first and third sets of ferroelectric memory cells are in adjacent rows.

12. The ferroelectric memory device of claim 7 where the segment further comprises:

a fifth set of ferroelectric memory cells associated with the at least two adjacent columns, the fifth set of ferroelectric memory cells associated with a third plategroup and accessible via a third wordline and a third plateline;

a sixth set of ferroelectric memory cells associated with a fourth plategroup and accessible via the third wordline and a fourth plateline;

first and third wordline drivers configured to independently assert the first and third wordlines; and third and fourth plateline drivers configured to independently assert the third and fourth platelines, respectively.

13. The ferroelectric memory device of claim 7, where the ferroelectric cells comprise at least one of the following memory cells: 1T1C memory cells and 2T2C memory cells.

14. The ferroelectric memory device of claim 7, further comprising:

another segment of contiguous ferroelectric memory cells, where sets of contiguous ferroelectric memory cells within the another segment are coupled to the first wordline; and peripheral circuitry disposed between the segment and the another segment.

15. The ferroelectric memory device of claim 14, where the peripheral circuitry comprises: the first and second plateline drivers.

16. The ferroelectric memory device of claim 15, where the peripheral circuitry comprises: a power conduit.

17. The ferroelectric memory device of claim 7, wherein the segment of contiguous ferroelectric memory cells includes columns of dummy ferroelectric memory cells.

18. The ferroelectric memory device of claim 17, where the columns of dummy memory cells are positioned at opposing ends of the segment.

19. A ferroelectric memory device, comprising:

a memory array subdivided into a number of segments with peripheral circuitry between adjacent segments, a segment including: a number of wordlines associated with a corresponding number of rows of contiguous ferroelectric memory cells, and a number of pair of complimentary bitlines associated with a corresponding number of columns of contiguous ferroelectric memory cells;

where within the segment, a first row of contiguous ferroelectric memory cells is accessible via a first wordline and associated with a first set of multiple plategroups of memory cells, where at least one of the plategroups in the first set is associated with adjacent columns;

where within the segment a second row of contiguous memory cells is accessible via a second wordline and associated with a second set of multiple plategroups of memory cells;

a first set of multiple plateline drivers that are configured to independently assert multiple platelines respectively associated with the first set of multiple plategroups; and a second set of multiple plateline drivers that are configured to independently assert multiple platelines which are associated with the second set of multiple plategroups and which are independent of the first set of multiple plategroups.

20. The ferroelectric memory device of claim 19, further comprising:

sense amps individually associated with individual columns of ferroelectric memory cells;

control circuitry configured to provide some sense amp control signals to less than all sense amps of the segment.

21. The ferroelectric memory device of claim 20, where the some sense amp control signals comprise at least one of the following sense amp control signals: a sense-amp power signal, a sense-amp pre-charge signal, a sense amp input activation signal, a sense-amp write back signal, and a sense-amp read/write between sense amp and local I/O line signal.

22. The ferroelectric memory device of claim 21, where in addition to the some sense amp control signals, other sense amp control signals are provided to all the sense amps.

23. The ferroelectric memory device of 22 where the other control signals comprise at least one of the following sense amp control signals; a bit-line pre-charge signal and a sense-amp pull-down signal.

24. The ferroelectric memory device of claim 19, where the ferroelectric cells comprise at least one of the following memory cells: 1T1C memory cells and 2T2C memory cells.

* * * * *